United States Patent [19]

Ishii et al.

[11] Patent Number: 5,067,089
[45] Date of Patent: Nov. 19, 1991

[54] DEVICE HAVING SIGNAL INTERPOLATION CIRCUIT AND DISPLACEMENT MEASURING APPARATUS COMPRISING THE DEVICE

[75] Inventors: Satoshi Ishii; Masaaki Tsukiji, both of Tokyo; Tetsuharu Nishimura, Kawasaki; Koh Ishizuka, Urawa, all of Japan

[73] Assignee: Canon Kabushiki Kaisha, Tokyo, Japan

[21] Appl. No.: 419,705

[22] Filed: Oct. 11, 1989

[51] Int. Cl.$^5$ .................. G01R 29/02; H03M 1/48
[52] U.S. Cl. .................................. 364/486; 341/111
[58] Field of Search ............... 364/486, 561; 356/373; 341/8, 111, 157

[56] References Cited

U.S. PATENT DOCUMENTS 4,829,342 5/1989 Nishimura .
4,868,385 9/1989 Nishimura .

FOREIGN PATENT DOCUMENTS 226546 6/1987 European Pat. Off. .
273518 7/1988 European Pat. Off. .
2100423 12/1982 United Kingdom .

Primary Examiner—Salvatore Cangialosi
Attorney, Agent, or Firm—Fitzpatrick, Cella, Harper & Scinto

[57] ABSTRACT

A device comprises output device for receiving signals having predetermined phases and outputting first and second signals having different phase angles and amplitudes, conversion device for converting the first signal into a first binary signal and the second signal into a second binary signal, the conversion device being arranged so that widths of the first and second binary signals are substantially equal to each other regardless of a difference in amplitude of the first and second signals, and generating device for generating first and second pulses according to phase angles on the basis of the first and second binary signals.

20 Claims, 4 Drawing Sheets

1

DEVICE HAVING SIGNAL INTERPOLATION CIRCUIT AND DISPLACEMENT MEASURING APPARATUS COMPRISING THE DEVICE

BACKGROUND OF THE INVENTION

The present invention relates to a device having a signal interpolation circuit for electrically interpolating (dividing) a signal having a predetermined phase and a displacement measuring apparatus comprising the device.

A conventional signal interpolation circuit shown in FIG. 1A is known. The circuit shown in FIG. 1A includes input terminals 1 and 2 for receiving sinusoidal wave signals of two different phase angles (0° and 90°), buffers 3 and 4, an inverting buffer 5 for inverting an input signal, conversion means 6 to 9 for converting a plurality of signals having different phase angles (0°, 45°, 90°, and 135°) obtained by mixing output signals at a predetermined ratio through a circuit (resistor circuit) including resistors $R_1$ to $R_4$ into rectangular wave signals, pulse generating means 10 to 13 for generating pulse signals corresponding to signals from the resistor circuit on the basis of the rectangular wave signals from the conversion means, an OR gate 14 for obtaining an interpolation pulse on the basis of the outputs from the pulse generating means 10 to 13, and an output terminal 15. The resistors $R_1$ to $R_4$ have the same resistance.

FIG. 1B shows in detail an arrangement of the conversion means 6 to 9 and the pulse generating means 10 to 13. The circuit shown in FIG. 1B includes a comparator 61 which has a hysteresis given by resistors $R_A$ and $R_B$ (resistances $r_A$ and $r_B$). The hysteresis is set to be positive/negative symmetrically about the center of a signal (zero-crossing point) by a bias voltage $V_B$. The circuit also includes a buffer 101, an inverter 102, one-shot multivibrators 103 and 104, and an OR gate 105.

The operation will be described below. Sinusoidal wave signals respectively having phase angles of 0° and 90° are input to the input terminals 1 and 2. Thus, sinusoidal wave signals having phase angles of 0°, 90°, and 180° are obtained from the outputs of the buffers 3 and 4 and the inverting buffer 5. Signals having phase angles 45° and 135° appear at nodes c and d in FIG. 1A since two signals are mixed by the resistors $R_1$ to $R_4$. The signals at these nodes have waveforms as shown in FIG. 1C.

The signals at nodes c to d are converted to rectangular wave signals by the conversion means 6 to 9, thus forming an interpolation pulse. This operation will be described below with reference to FIG. 1C. For example, the sinusoidal wave signal at the node a is converted to the rectangular wave signal by the comparator 61. At this time, if a peak-to-peak value of the output voltage of the comparator 61 is represented by $V_P$, the hysteresis width described above is expressed by $V_P \times \{r_A/(r_A+r_B)\}$. The rectangular wave signal passes through the buffer 101 and the inverter 102, and waveform signals e and f in FIG. 1C are obtained. At the leading edges of these signals e and f, the one-shot multivibrators 103 and 104 generate pulses, and a waveform signal g shown in FIG. 1C, i.e., a pulse signal corresponding to the above-mentioned phase angle is obtained as an output of the OR gate 105. The similar operation is performed in the conversion means 7 to 9 and the pulse generating means 11 to 13 having the same arrangement as described above, and a pulse train h in FIG. 1C is obtained as an output of the OR gate 14 at the final stage.

As a result, an interpolation pulse train corresponding to the phase angles 0°, 45°, 90°, and 135° and their inverted phase angles 180°, 225°, 270°, and 315° is obtained. Thus, a period of an input sinusoidal wave signal can be divided into eight sections.

However, in the conventional interpolation circuit, since the amplitudes of the sinusoidal wave signals (having phase angles of 45° and 135°) formed upon signal mixing by the resistors are smaller than those of the sinusoidal wave signals having the phase angles of 0° and 90° corresponding to original signals input to the terminals 1 and 2, the durations of rectangular wave signals generated through the comparators 6 of the conversion means 6 to 9 are varied. Therefore, an interpolation pulse interval also varies, and interpolation precision is degraded. In particular, when a large hysteresis width is set to prevent an erroneous operation caused by external noise or the like, interpolation precision is further degraded.

SUMMARY OF THE INVENTION

The present invention has been made in consideration of the above situation, and has as its object to provide a device having a signal interpolation circuit having high interpolation precision.

It is another object of the present invention to provide a device having a signal interpolation circuit which is not easily influenced by external noise and has high interpolation precision.

It is still another object of the present invention to provide a displacement measuring apparatus comprising a device having a signal interpolation circuit for stably interpolating signals.

In order to achieve the first object, a device of the present invention comprises means for receiving signals having predetermined phases and outputting first and second signals having different phase angles and amplitudes; and conversion means for converting the first signal into a first binary signal and the second signal into a second binary signal. The conversion means is arranged so that the widths of the first and second binary signals are substantially equal to each other regardless of a difference in amplitude of the first and second signals. The device further comprises means for generating first and second pulses according to phase angles in accordance with the first and second binary signals.

In order to achieve the above-mentioned another object, another device of the present invention comprises means for receiving signals having predetermined phases and outputting first and second signals having different phase angles and amplitudes; a first comparator, having a first hysteresis, for converting the first signal into a first binary signal; and a second comparator, having a second hysteresis, for converting the second signal into a second binary signal. The widths of the first and second hystereses are set so that the widths of the first and second binary signals are substantially equal to each other regardless of a difference in amplitude of the first and second signals. The device further comprises means for generating first and second pulses according to phase angles in accordance with the first and second binary signals.

In order to achieve the above-mentioned still another object, a displacement measuring apparatus of the present invention comprises reading means for reading scale marks formed on a movable scale and outputting a plurality of almost sinusoidal signals having different phase angles in accordance with a displacement of the scale; means for receiving the plurality of signals and outputting first and second signals having different phase angles and amplitudes; and means for converting the first signal into a first binary signal and the second signal into a second binary signal. The conversion means is arranged so that the widths of the first and second binary signals are substantially equal to each other regardless of a difference in amplitude of the first and second signals. The apparatus further comprises means for generating first and second pulses according to phase angles in accordance with the first and second binary signals, and measures the displacement of the scale on the basis of the first and second pulses.

As the conversion means of the displacement measuring apparatus, a plurality of comparators are used. Hysteresis widths of the comparators are set to be predetermined values in units of comparators, so that the first, second, and third binary signals are set to be substantially equal to each other.

Some features and detailed forms of the present invention are described in the embodiments to be described later.

DESCRIPTION OF THE PREFERRED EMBODIMENTS

Figure 1A:
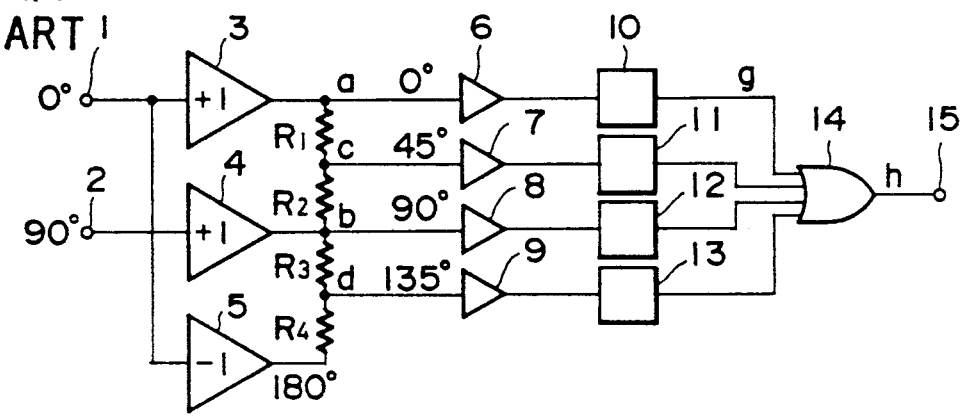
FIG. 1A is a circuit diagram showing a conventional interpolation circuit.
Figure 1B:
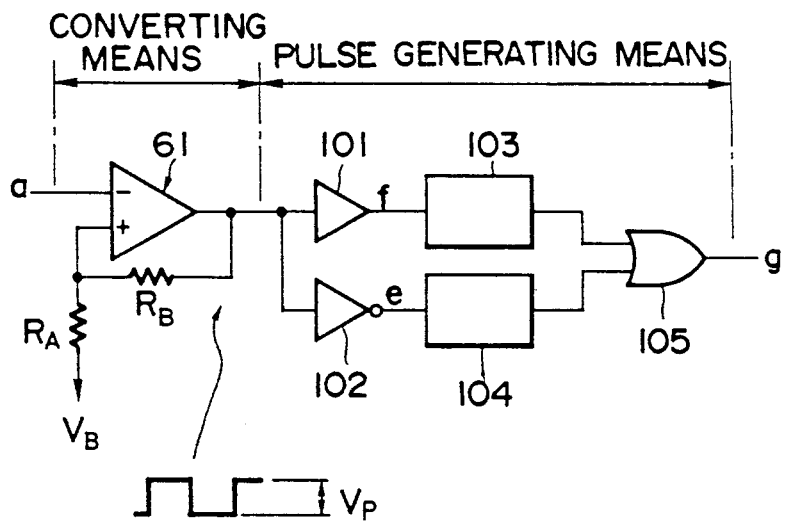
FIGS. 1B is a circuit diagram showing a detailed arrangement of a conversion means and a pulse generating means shown in FIG. 1A.
Figure 1C:
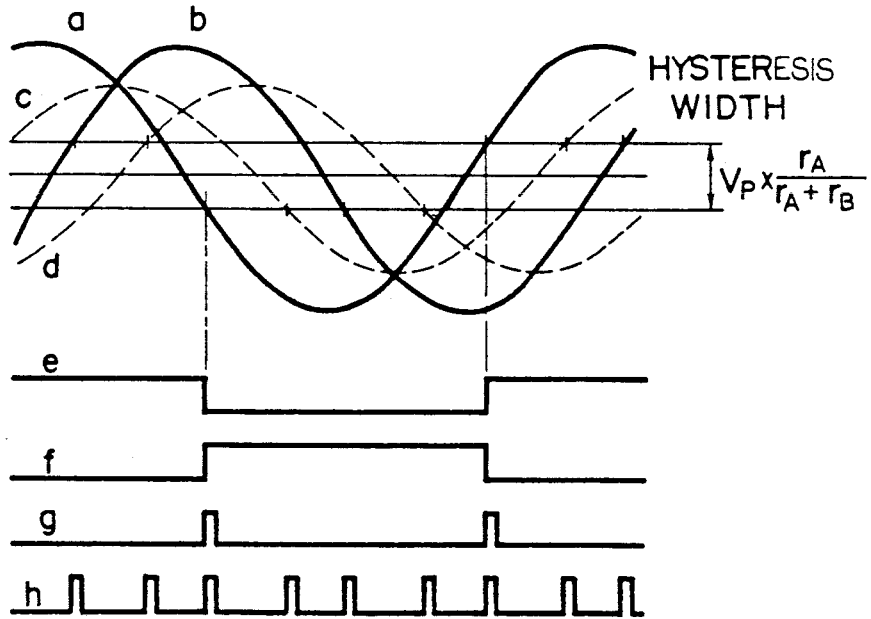
FIG. 1C is a waveform chart showing waveforms of signals at nodes a to h shown in FIGS. 1A and 1B.
Figure 2:
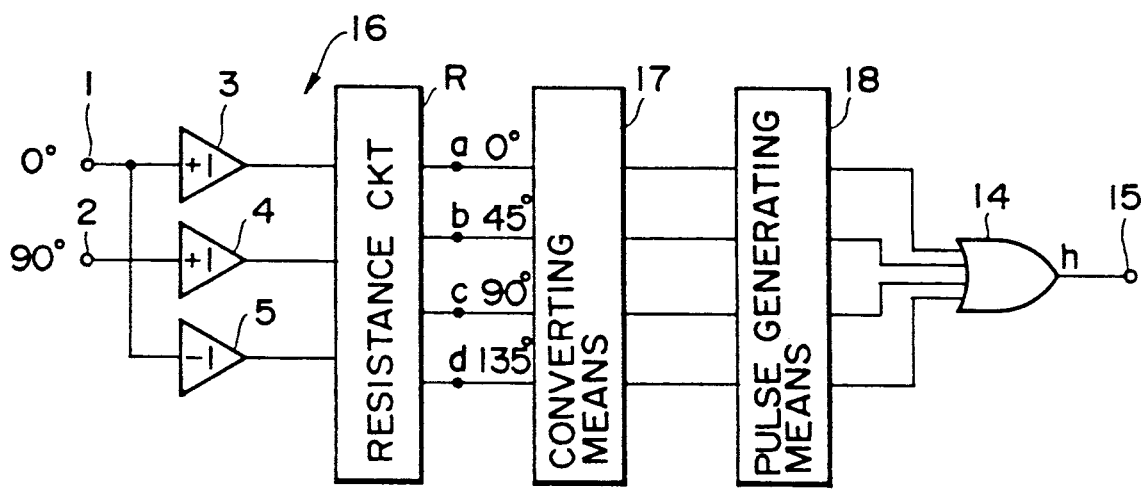
FIG. 2 is a block diagram showing an embodiment of the present invention.

FIG. 2 is a block diagram showing a circuit arrangement of a signal interpolation circuit of a device according to the present invention. The circuit shown in FIG. 2 includes input terminals 1 and 2 for receiving sinusoidal wave signals (0° and 90° signals) having two different phase angles, a mixing means 16, buffers 3 and 4, an inverting buffer 5, and a resistor circuit R for generating signals having predetermined phase angles on the basis of signals obtained through these buffers 3, 4, and 5, i.e., sinusoidal wave signals and their inverted signals. The resistor circuit R is constituted by resistors $R_1$ to $R_4$ having the same resistance as in FIG. 1. The mixing means 16 includes these buffers 3, 4, and 5 and the resistors $R_1$ to $R_4$. The circuit shown in FIG. 2 also includes a converting means 17 for converting a plurality of predetermined signals having different phase angles obtained upon signal mixing by the mixing means 16 into rectangular wave signals (binary signals), a pulse generating means 18 for generating pulse signals corresponding to the phase angles on the basis of the rectangular wave signals; an OR gate 14 for obtaining an interpolation pulse on the basis of the output from the pulse generating means 18, and an interpolation pulse output terminal 15.

Figure 3:
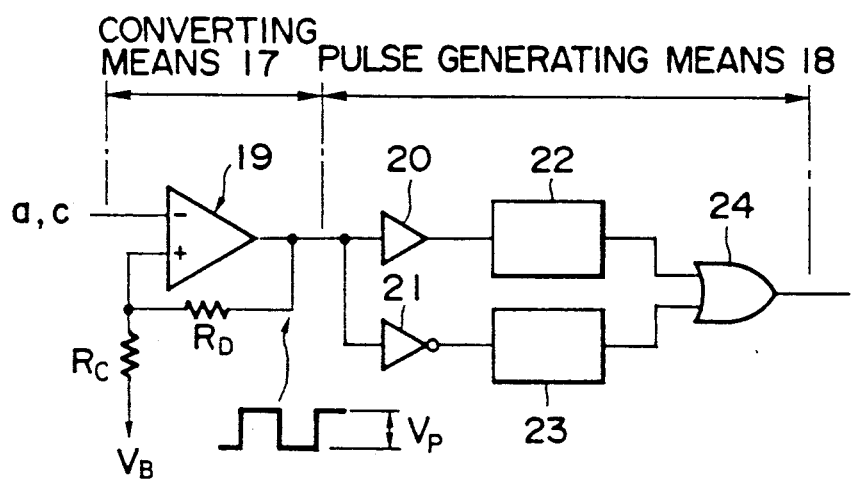
FIG. 3 is a circuit diagram showing a detailed arrangement of a conversion means and a pulse generating means shown in FIG. 2.

The conversion means 17 and the pulse generating means 18 are arranged so that predetermined conversion means and pulse generating means are arranged in units of signals of arbitrary phase angles (0°, 45°, 90°, and 135° in this embodiment) obtained by mixing the two signals input at the terminals 1 and 2, and have the circuit arrangement shown in FIG. 3. Each conversion means comprises a comparator 19. The comparator 19 has a hysteresis by resistors $R_C$ and $R_D$. The width of the hysteresis is set to be a value proportional to the amplitude of a signal from the mixing means 16 for each comparator 19, and has the relationship shown in Table 1 below.

TABLE 1

| PHASE ANGLE | RESISTANCE OF $R_C$ | RESISTANCE OF $R_D$ | HYSTERESIS WIDTH |
|---|---|---|---|
| a 0°<br>b 90° | $r_c$ | $r_D$ | $V_P \times \dfrac{r_C}{r_C + r_D}$ |
| c 45°<br>d 135° | $\dfrac{r_C r_D}{(\sqrt{2} - 1) r_C + \sqrt{2}\, r_D}$ | $r_D$ | $\dfrac{V_P}{\sqrt{2}} \times \dfrac{r_C}{r_C + r_D}$ |

In this case, the resistance of a resistor $R_D$ of the conversion means 17 is assumed to be $r_D$ and the resistance of a resistor $R_C$ to which a signal having a phase angle of 0° is input is assumed to be $r_C$ to calculate the resistances of comparators 19 to which signals of other phase angles are input. In this table, $V_P$ is a peak-to-peak value of the output voltage of each comparator 19.

Therefore, in this embodiment, the hysteresis widths of the comparators 19 which receive signals having the phase angles of 0° and 90° corresponding to the two signals input to the input terminals 1 and 2 are set to be equal to each other, and the hysteresis widths of the comparators 19 which receive new signals having phase angles of 45° and 135° formed upon operation of the mixing means 16 are set to be equal to each other. The comparators 19 corresponding to the signals having the phase angles of 0° and 90° and the comparators 19 corresponding to the signals having the phase angles of 45° and 135° have different hysteresis widths. With this arrangement, the widths of rectangular wave signals corresponding to 0°, 45°, 90°, and 135° output from the conversion means 17 become almost equal to each other, as will be described later.

The pulse generating means 18 comprises a buffer 20, an inverter 21, one-shot multivibrators 22 and 23 which are operated in response to outputs from the buffer 20 and the inverter 21, and an OR gate 24. As described above, four circuits shown in FIG. 3 are combined to constitute the conversion means 17 and the pulse generating means 18.

The operation will be described below. Sinusoidal wave signals having phase angles of 0° and 90° and a sinusoidal wave signal having a phase angle of 180° as an inverted signal of the signal having the phase angle of 0° which are obtained from the input terminals 1 and 2 through the buffers 3 to 5 are mixed upon operation of the resistors $R_1$ to $R_4$ constituting the mixing means 16 into four signals having phase angles of 0°, 45°, 90°, and 135°. These four signals having different phase angles are converted into rectangular wave signals by the conversion means 17, and the rectangular wave signals are input to the pulse generating means 18. As a result, four signals consisting of a pulse train in which pulses are aligned at given intervals are output from the pulse generating means 18, and an interpolation pulse (pulse train) appears at the output terminal 15 through the OR gate 14.

Figure 4:
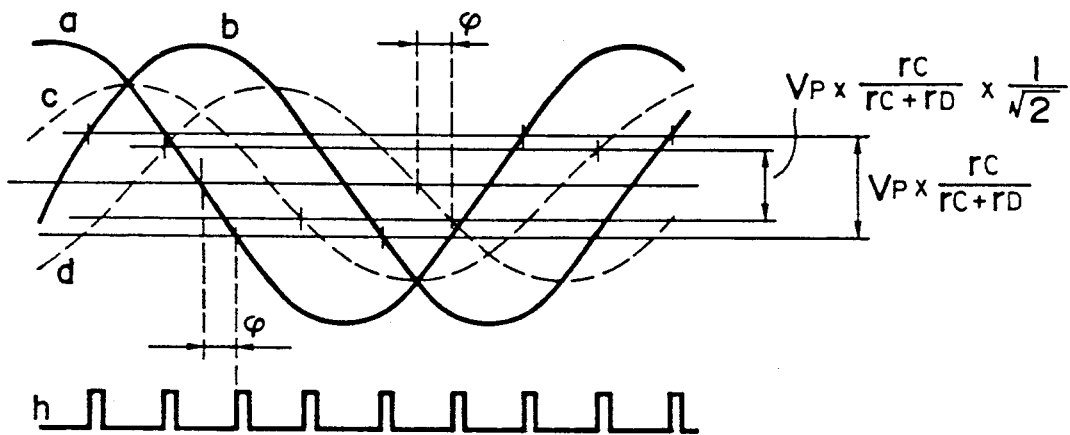
FIG. 4 is a waveform chart showing waveforms of signals at nodes a to d and h in FIG. 2.

FIG. 4 shows signal waveforms at nodes a to d and h in FIG. 2. As shown in FIG. 4, the amplitudes of signals having the phase angles of 45° and 135° at nodes c and d are $1/\sqrt{2}$ of those of the signals having the phase angles 0° and 90° at nodes a and b. As shown in Table 1, the hysteresis widths of the comparators 19 of the conversion means 17 corresponding to the signals having the phase angles of 45° and 135° are set to be $1/\sqrt{2}$ of the hysteresis widths of the comparators 19 corresponding to the signals having the phase angles of 0° and 90°. Thus, even when some of a plurality of signals from the mixing means 16 have different amplitudes, the operating positions for the corresponding signals of the comparators 19 are located at points offset by the same phase angle $\phi$ from the zero-crossing points of the signals. As a result, the widths of the rectangular wave signals output from the comparators 19 become almost equal to each other, and interpolation pulses appearing at the h are aligned at equal intervals with high precision. That is, interpolation precision can be greatly improved. In this case, even when the hysteresis widths of the comparators 19 are considerably increased, interpolation precision is not impaired in principle. Thus, the hysteresis widths of the comparators 19 can be set to be relatively large, and an interpolation circuit which is not easily influenced by external noise or the like can be realized.

In this embodiment, a period of a sinusoidal wave signal input to the input terminal 1 or 2 is divided into eight sections. However, the present invention is not limited to this but arbitrary number of divisions may be adopted. That is, like in this embodiment, the hysteresis widths of the comparators can be set to be proportional to amplitudes of signals having different phase angles obtained from the mixing means 16. In this case, "proportion" is not limited to a case wherein numerical values are strictly proportional to each other, but may include a case wherein numerical values are almost proportional to each other in consideration of an error caused by a tolerance of an element or an allowance in performance of a machine to be used.

According to this embodiment, the hysteresis widths of the comparators constituting the conversion means 17 are set to be predetermined values on the basis of the amplitudes of signals from the mixing means 16. Thus, interpolation precision of signals input to the device can be greatly improved. Since the wide hysteresis widths can be set, a device comprising a signal interpolation circuit which is not easily influenced by external noise and has high precision can be realized.

Figure 5:
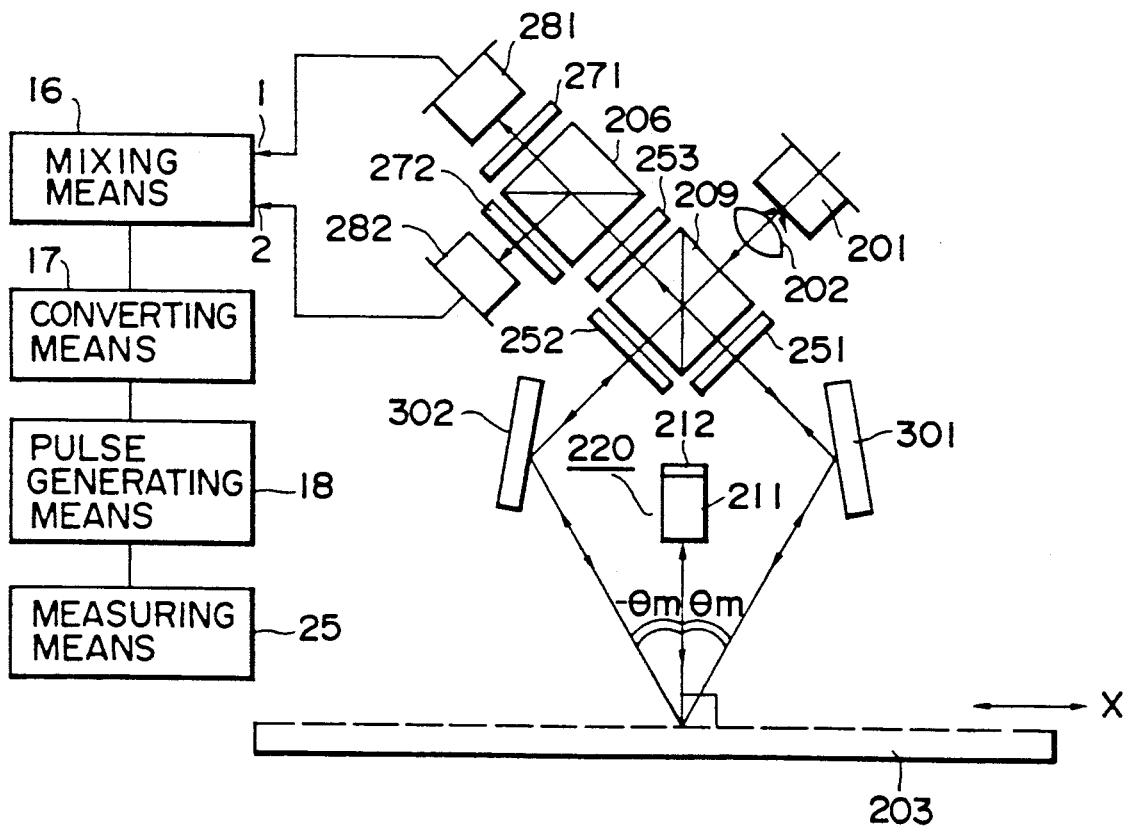
FIG. 5 is a schematic view of an embodiment of a displacement measuring apparatus according to the present invention.

FIG. 5 is a schematic diagram of an optical system showing an embodiment of the optical type encoder having the device of the present invention.

In FIG. 5, the reference numeral 201 designates a semiconductor laser, the reference numeral 202 denotes a collimator lens, and the reference numeral 203 designates an optical type scale having a diffraction grating of grating pitch d mounted on a moving object to be measured, not shown, and moving in the direction of arrow X at a velocity v. The reference numeral 209 denotes a polarizing beam splitter, the reference numerals 251 and 252 designate quarter wavelength plates, the reference numerals 301 and 302 denote reflecting mirrors, the reference numeral 206 designates a beam splitter, and the reference numerals 71 and 272 denote polarizing plates whose polarization axes are orthogonal to each other and disposed so as to form an angle of 45° with the polarization axes of the quarter wavelength plates 251 and 252. The reference numerals 281 and 282 designate light-receiving elements which photoelectrically detect interference light. The reference numeral 211 denotes an index distribution type stick-like lens with planar opposite ends for focusing a light incident from one end surface on the other end surface, and a reflecting film 212 is applied to the other end surface thereof. The lens 211 and the reflecting film 212 together constitute a reflecting system 220.

In the present embodiment, a coherent light beam from the semiconductor laser 201 is substantially collimated by the collimator lens 202 and is caused to enter the polarizing beam splitter 209, whereby it is divided into two light beams, i.e., a transmitted light beam which is linearly polarized light (P-polarized light) and a reflected light beam which is linearly polarized light (S-polarized light). The mounted position of the semiconductor laser 201 is adjusted so that at this time, the direction of linear polarization of the emergent light beam from the semiconductor laser 201 is 45° with respect to the direction of polarization of the polarizing beam splitter 209. Thereby, the intensity ratio between the transmitted light beam and the reflected light beam from the polarizing beam splitter 209 is about 1:1.

The reflected light beam and the transmitted light beam from the polarizing beam splitter 209 are made into circularly polarized lights through the quarter wavelength plates 251 and 252, respectively, are reflected by the reflecting mirrors 301 and 302 and are caused to obliquely enter the optical type scale 203. Each light beam is caused to enter the optical type scale 203 so that the ±1st-order diffracted light from the optical type scale 203 emerges substantially perpendicularly from the diffraction grating surface of the optical type scale 203.

That is, each light beam is caused to enter the optical type scale 203 so that $$\theta m \approx \sin^{-1}(m\lambda/P), \qquad (1)$$

where P is the grating pitch of the diffraction grating of the optical type scale 203, $\lambda$ is the wavelength of the coherent light beam from the semiconductor laser 201, m is an integer, and $\theta m$ is the angle of incidence of the coherent light beam onto the diffraction grating surface (the angle from the direction perpendicular to the diffraction grating surface).

The reflected light beam from the polarizing beam splitter 209 obliquely enters the optical type scale 203 through the mirror 301 at the angle of incidence $\theta m$, and is reflected and diffracted by the diffraction grating of the optical type scale 203, and the 1st-order diffracted light emerges perpendicularly from the optical type scale 203. On the other hand, the transmitted light beam from the polarizing beam splitter 9 obliquely enters the optical type scale 203 through the mirror 302 at the angle of incidence-$\theta m$, and is reflected and diffracted by the diffraction grating of the optical type scale 203, and the-1st-order diffracted light emerges perpendicularly from the optical type scale 203. In the present embodiment, the positions of incidence of the reflected light beam and the transmitted light beam onto the optical type scale 203 are the same, and a pair of ($\pm$1st-order) diffracted lights emerging perpendicularly from the optical type scale 3 overlap each other. Thus, these reflected and diffracted lights form a common optical path. The optical paths of the transmitted light beam and the reflected light from the polarizing beam splitter 209 and of the reflected and diffracted lights are contained in the same incidence plane (a plane parallel to the plane of the drawing sheet).

Figure 6:
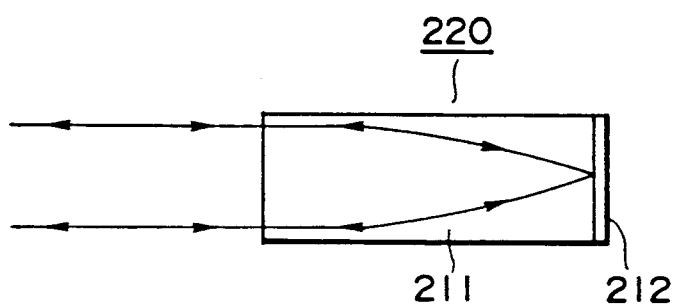
FIG. 6 is a schematic view showing an arrangement of a reflecting system 220 shown in FIG. 5.

The $\pm$1st-order diffracted lights which have emerged perpendicularly from the optical type scale -203 travel toward the reflecting system 220 and enter the end surface of the lens 211. The lens 211, which is a stick-like lens, has its length set so that a parallel light having entered one end surface thereof is focused on the other end surface. That is, the focal plane of the system 220 is on the end surface of the element. The reflecting film 212 is formed on said other end surface. Accordingly, the $\pm$1st-order diffracted lights having emerged substantially perpendicularly from the optical type scale 203 are caused to enter the lens 211. Since the reflecting film 212 is provided at the focal plane to the lens 11, the lights are reflected by the reflecting film 212 as shown in FIG. 6, whereafter they return along the original optical path, emerge from the lens 211 and enter the optical type scale 203.

The $\pm$1st-order reflected and diffracted lights again diffracted by the diffraction grating of the optical type scale 203 return along the original optical path, are reflected by the reflecting mirrors 301 and 302, are transmitted through the quarter wavelength plates 251 and 252 and again enter the polarizing beam splitter 209.

At this time, the re-diffracted lights pass again through the quarter wavelength plates 251 and 252 and therefore, the (S-polarized) light beam reflected at first by the polarizing beam splitter 209, when re-entering the polarizing beam splitter, becomes P-polarized light whose direction of polarization relative to the polarizing beam splitter 9 differs by 90°, and thus, it is transmitted through the polarizing beam splitter 209. Conversely, the (P-polarized) light beam transmitted at first through the polarizing beam splitter 209 becomes S-polarized light and is reflected by the polarizing beam splitter 209 when it re-enters the polarizing beam splitter.

Thus, the two re-diffracted lights are caused to overlap each other by the polarizing beam splitter 9, and are made into circularly polarized lights opposite in direction to each other through the quarter wavelength plate 253 and are divided into two light beams by the beam splitter 206, and are made into linearly polarized lights through the polarizing plates 271 and 272, respectively, whereafter they are caused to enter the light-receiving elements 281 and 282, respectively.

The angle of incidence $\theta m$ in formula (1) may be of a value within the range over which the diffracted light can enter the reflecting element 220 and again enter the optical type scale 203.

In the present embodiment, the phase of the $\pm$1st-order diffracted light varies by $\pm 2\pi$ when the diffraction grating moves by one pitch. Accordingly, the light-receiving elements 281 and 282 receive the interference light produced by the light beams which have undergone positive and negative 1st-order diffractions twice each and photoelectrically the interference light and therefore, when the diffraction grating moves by an amount corresponding to one pitch of the grating, there are obtained 4 sine wave signals from the light-receiving elements 281 and 282, respectively.

Accordingly, the pitch of the diffraction grating of the optical type scale 203 is 3.2 $\mu m$ and $\pm$1st-order is utilized as the diffracted lights and therefore, when the optical type scale 203 moves by 3.2 $\mu m$, there are obtained four sine wave signals from the light-receiving elements 281 and 282. That is, $\frac{1}{4}$ of the pitch of the diffraction grating, i.e., 3.2/4=0.8 $\mu m$, is obtained as the resolving power per sine wave.

Also, a phase difference of 90° is provided between the output signals from the light-receiving elements 281 and 282 by a combination of the quarter wavelength plates 251, 252, 253 and the polarizing plates 271, 272 so that the direction of movements of the diffraction grating can be discriminated.

In the present embodiment, the optical paths of the $\pm$1st-order diffracted lights emerging from the optical type scale 203 are made common and these diffracted lights are again directed to the optical type scale 203 through the common reflecting element 20. That is, individual reflecting mirrors need not be provided for individual diffracted lights and therefore, the apparatus can be constructed compactly and simply. Also, thereby, the rate at which stray lights are created and reach the light-receiving elements 281 and 282 is decreased to improve the detection accuracy of interference light.

Further, as shown in FIG. 5; all the parts constituting the apparatus can readily be provided above (on one side) of the optical type scale 3 and thus, an optical type encoder very rich in versatility is provided.

The reflecting system 220 in the present embodiment has its reflecting surface at the focal plane and therefore, even if for example, the angle of diffraction resulting from the oscillation wavelength of the laser beam varies minutely to thereby vary more or less the angle of incidence onto the lens 211, the diffracted lights can be returned to the optical type scale 203 along substantially the same optical path. Thereby, the two positive and negative diffracted lights are caused to overlap each other accurately, with a result that a reduction in the S/N ratio of the output signals of the light-receiving elements 281 and 282 is prevented. Also, by the angle of incidence $\theta m$ of the coherent light beam onto the optical type scale 203 being set as previously described and by the reflecting element 220 being used, compactness of the entire apparatus is achieved.

Accordingly, if the grating pitch of the diffraction grating of the optical type scale 203 is 3.2 $\mu m$ and the wavelength of the laser 201 is 0.78 $\mu$, the angle of diffraction of $\pm$1st-order diffracted lights is 14.2° as previously mentioned. So, where an index distribution type lens having a diameter of the order of 2 mm is used as the lens 211 to reflect only $\pm$1st-order diffracted lights, the distance from the optical type scale 203 to the lens 211 is 2/tan 14.2°=7.9 mm, and the two can be spaced apart from each other by the order of 8 mm and thus, the entire apparatus can be constructed very compactly.

In the present embodiment, the optical path lengths of a pair of re-diffracted lights forming interference light on the light-receiving elements 281 and 282 are equal to each other. Accordingly, even if the wavelength of the semiconductor laser 201 varies, interference light reacting to only the displacement of the optical type scale 203 can be formed. Also, an inexpensive multimode semiconductor laser can be carried as a light-emitting element on the apparatus.

In the present embodiment, as will be seen from FIG. 5, the optical path by the optical system comprising the polarizing beam splitter 209, the reflecting mirrors 301, 302 and the reflecting system 220 is bisymmetrical and constitutes a system insensitive to the disturbance such as vertical movement of the optical type scale 203.

Figure 7:
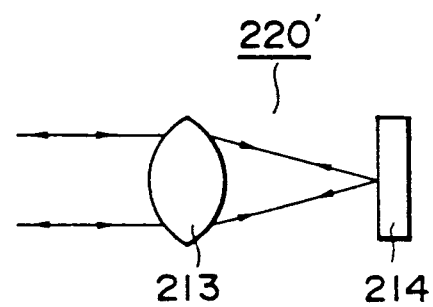
FIG. 7 is a schematic view showing another arrangement of the reflecting system 220 shown in FIG. 5.

Also, in the present embodiment, an index distribution type lens is used as the lens 211, but as shown in FIG. 7, the reflecting system 220 may be constituted by a combination of a condensing lens 213 and a reflecting mirror 214.

Figure 8:
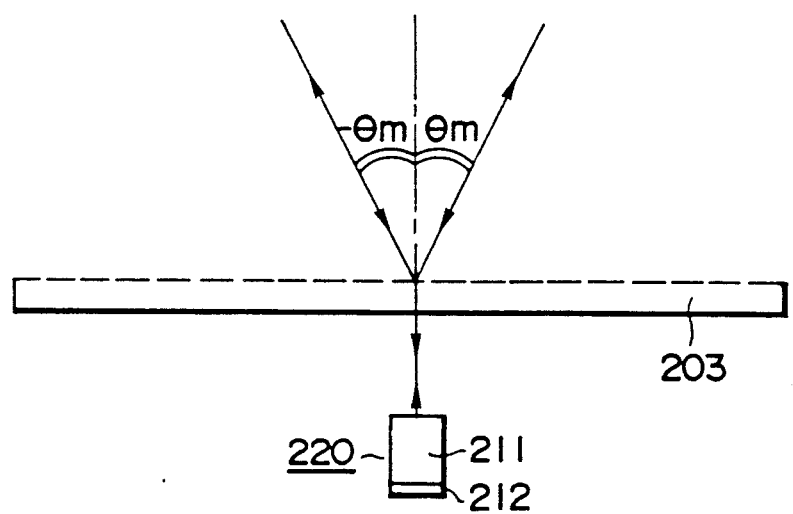
FIG. 8 is an explanatory view showing a 25 modification of the apparatus shown in FIG. 5.

Also, in the present embodiment, the reflected and diffracted light is again directed to the optical type scale 203, but as shown in FIG. 8, the reflecting element 220 may be disposed on the other side of the optical type scale 203 to direct the transmitted and diffracted light again to the optical type scale 203.

In FIG. 5, two signals having a 90° phase difference obtained from the light-receiving elements 281 and 282 are input to the input terminals 1 and 2 of the mixing means 16 as a sinusoidal wave signal having a phase angle of 0° and a sinusoidal wave signal having a phase angle of 90°. These signals are then processed by the mixing means 16, the conversion means 17, and the pulse generating means 18. The mixing means 16, the conversion means 17, and the pulse generating means 18 have the arrangements shown in FIGS. 2 and 3. Therefore, interpolation pulses (pulse train) in which pulses are aligned at equal intervals generated by a signal interpolation circuit comprising these means are input to a measuring means 25. The measuring means 25 sequentially counts the pulses of the interpolation pulse train to obtain a moving amount of the scale 203.

The displacement measuring apparatus interpolates (divides) signals output from the light-receiving elements 281 and 282, and generates eight pulses per period of each signal. Therefore, this apparatus can measure a displacement of the scale 203 with a very high resolution. Since intervals of pulses generated by interpolation are always equal to each other, measurement precision is also high.

And, further, it can be clearly understood that mode of the displacement measuring apparatus according to the present invention is not limited to one shown in FIGS. 5 to 8.

What is claimed is:

1. A device comprising:
    output means for receiving signals having predetermined phases and outputtting first and second signals having different phase angles and amplitudes;
    conversion means for converting the first signal into a first binary signal and the second signal into a second binary signal, said conversion means comprising means for forming substantially equal width first and second binary signals regardless of a difference in amplitude of said first and second signals; and
    means for generating first and second pulses according to the phase angles on the basis of said first and second binary signals.

2. A device according to claim 1, wherein said output means comprises an assembly of buffers and resistors.

3. A device according to claim 2, wherein said output means receives a signal having a phase angle of 0° and a signal having a phase angle of 90° as the predetermined phases.

4. A device according to claim 2, wherein said first and second binary signal forming means comprises:
    a first comparator, having a first hysteresis of a first width, for converting said first signal into a first binary signal;
    a second comparator, having a second hysteresis of a second width, for converting said second second signal into a second binary signal, the first and second hysteresis widths being different so that widths of said first and second binary signals are substantially equal to each other.

5. A device comprising:
    output means for receiving signals having predetermined phases and outputtting first and second signals having different phase angles and amplitudes;
    a first comparator, having a first hysteresis settable to a first width, for converting said first signal into a first binary signal;
    a second comparator, having a second hysteresis settable to a second width, for converting said second signal into a second binary signal, the first and second hysteresis widths being set so that said first and second binary signals have substantially equal widths regardless of a difference in amplitude of said first and second signals; and
    generating means for generating first and second pulses according to the phase angles on the basis of said first and second binary signals.

6. A device according to claim 5, wherein widths of the first and second hystereses are different from each other.

7. A device according to claim 6, wherein said output means outputs said second signal having an amplitude smaller than that of said first signal, and
    the second comparator hysteresis width is set smaller than the first comparator hysteresis width.

8. A device according to claim 7, wherein said generating means comprises:
    a first circuit for receiving said first binary signal and generating said first pulse in response to a leading edge of said first binary signal; and
    a second circuit for receiving said second binary signal and generating said second pulse in response to a leading edge of said second binary signal.

9. A device according to claim 8, further comprising an OR gate for receiving said first and second pulses and forming a predetermined pulse train.

10. A method of generating first and second pulses according to phase angles of signals using a first signal and a second signal having a smaller amplitude than that of said first signal and a phase angle different from that of said first signal, comprising:
    a first step of converting said first signal into a first binary signal;
    a second step of converting said second signal into a second binary signal, said second step including forming a width of said second binary signal almost equal to a width of said first binary signal; and a third step of generating said first and second pulses on the basis of said first and second binary signals.

11. A method according to claim 10, wherein the first step includes the step of inputting said first signal to a comparator having a first hysteresis to cause said comparator to binarize said first signal, and the second step includes inputting said second signal to a comparator having a second hysteresis to cause said comparator having the second hysteresis to binarize said second signal, and setting a width of the second hysteresis smaller than the first hysteresis width and so that the width of said second binary signal is almost equal to the width of said first binary signal.

12. A method according to claim 11, wherein the third step includes:

the step of forming an inverted signal of said first binary signal;

the step of forming an inverted signal of said second binary signal;

the step of generating pulses in response to leading edges of said first binary signal and the inverted signal thereof; and the step of generating pulses in response to leading edges of said second binary signal and the inverted signal thereof.

13. A method according to claim 12, wherein said third step further includes:

the step of converting the pulses obtained by the leading edge responsive generating steps into a pulse train in which pulses are aligned at equal intervals through an OR gate.

14. A displacement measuring apparatus comprising:
reading means for reading scale marks formed on a movable scale and outputting a plurality of almost sinusoidal wave signals having different phase angles according to a displacement of said scale;
output means for receiving the plurality of signals and outputting first and second signals having different phase angles and amplitudes;
conversion means for converting said first signal into a first binary signal and said second signal into a second binary signal, said conversion means comprising means for forming almost equal width first and second binary signals regardless of a difference in amplitude of said first and second signals; and
means for generating first and second pulses according to the phase angles on the basis of said first and second binary signals, the displacement of said scale being measured on the basis of the first and second pulses.

15. An apparatus according to claim 14, wherein the almost sinusoidal signals include a signal having a phase angle of 0° and a signal having a phase angle of 90°.

16. An apparatus according to claim 15, wherein said means for forming almost equal width first and second binary signals comprises:

a first comparator, having a first hysteresis settable to a first width, for converting said first signal into said first binary signal;

a second comparator, having a second hysteresis almost equal to that of the first hysteresis of said first comparator and settable to a second width, for converting said second signal into said second binary signal, and means for setting the first and second hysteresis widths so that widths of said first and second binary signals are almost equal to each other.

17. An apparatus according to claim 16, wherein said second comparator is arranged so that said second signal includes a plurality of signals having different phase angles, and said second binary signal includes a plurality of binary signals.

18. An apparatus according to claim 16, wherein when an amplitude of said second signal is smaller than that of said first signal, the width of the hysteresis of said second comparator is set to be smaller than that of said first comparator.

19. An apparatus according to claim 18, further comprising:

means for converting the first and second pulses into a pulse train.

20. A device comprising:

output means for receiving signals having predetermined phases and outputting first and second signals having different phase angles and amplitudes;

first conversion means for converting said first signal into a first binary signal, said first conversion means comprising a first comparator;

second conversion means for converting said second signal into a second binary signal, said second conversion means comprising a second comparator, and means for setting a ratio of a hysteresis of said second comparator to the amplitude of said second signal to almost coincide with a ratio of a hysteresis of said first comparator to the amplitude of said first signal; and means for generating first and second pulses according to the phase angles on the basis of said first and second binary signals.

* * * * *

UNITED STATES PATENT AND TRADEMARK OFFICE
CERTIFICATE OF CORRECTION

PATENT NO. : 5,067,089
DATED : November 19, 1991
INVENTOR(S) : SATOSHI ISHII ET AL.    Page 1 of 2

It is certified that error appears in the above-identified patent and that said Letters Patent is hereby corrected as shown below:

ON THE TITLE PAGE

AT [30] FOREIGN APPLICATION PRIORITY DATA

Insert, --[30] Foreign Application Priority Data
Oct. 12, 1988 [JP] Japan .....63-254806--.

COLUMN 1

Line 28, "$R_4$have" should read --$R_4$ have--.

COLUMN 3

Line 48, "25" should be deleted.
Line 63, "$R_4$hav-" should read --$R_4$ hav- --.

COLUMN 6

Line 12, "numerals 71" should read --numerals 271--.

COLUMN 7

Line 21, "-203" should read --203--.
Line 31, "lens 11," should read --lens 211,--.

COLUMN 8

Line 12, "the-diffraction" should read
--the diffraction--.
Line 38, "FIG. 5;" should read --FIG. 5,--.

UNITED STATES PATENT AND TRADEMARK OFFICE
CERTIFICATE OF CORRECTION

PATENT NO. : 5,067,089
DATED : November 19, 1991
INVENTOR(S) : SATOSHI ISHII ET AL.

It is certified that error appears in the above-identified patent and that said Letters Patent is hereby corrected as shown below:

COLUMN 10

Line 16, "second second" should read --second--.

Signed and Sealed this

Eighth Day of June, 1993

Attest:

MICHAEL K. KIRK

Attesting Officer

Acting Commissioner of Patents and Trademarks